(12) United States Patent
Uchiyama

(10) Patent No.: US 8,523,636 B2
(45) Date of Patent: Sep. 3, 2013

(54) WORKING OBJECT GRINDING METHOD

(75) Inventor: Naoki Uchiyama, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 485 days.

(21) Appl. No.: 12/744,714

(22) PCT Filed: Nov. 18, 2008

(86) PCT No.: PCT/JP2008/070947
§ 371 (c)(1), (2), (4) Date: Aug. 23, 2010

(87) PCT Pub. No.: WO2009/069509
PCT Pub. Date: Jun. 4, 2009

(65) Prior Publication Data
US 2010/0311313 A1  Dec. 9, 2010

(30) Foreign Application Priority Data
Nov. 30, 2007 (JP) .................................. 2007-311643

(51) Int. Cl.
*B24B 1/00* (2006.01)

(52) U.S. Cl.
USPC ........... 451/57; 451/5; 451/6; 451/41; 451/58

(58) Field of Classification Search
USPC .................... 451/5, 6, 41, 57, 58; 219/121.6; 216/38, 52, 65, 88–89; 438/690–693; 257/E21.214, E21.23; 205/662–663
See application file for complete search history.

(56) References Cited

U.S. PATENT DOCUMENTS

| 4,546,231 | A | 10/1985 | Gresser et al. |
| 6,992,026 | B2 * | 1/2006 | Fukuyo et al. ................. 438/797 |
| 7,174,620 | B2 * | 2/2007 | Chiba et al. .................... 29/594 |
| 7,396,742 | B2 | 7/2008 | Fukuyo et al. |
| 7,462,094 | B2 * | 12/2008 | Yoshida et al. ................. 451/41 |
| 7,489,454 | B2 | 2/2009 | Fukuyo et al. |
| 7,547,613 | B2 | 6/2009 | Fukuyo et al. |

(Continued)

FOREIGN PATENT DOCUMENTS

| CN | 1160228 A | 9/1997 |
| CN | 1925128 | 3/2007 |

(Continued)

OTHER PUBLICATIONS

U.S. Appl. No. 13/206,181, filed Aug. 9, 2011.

(Continued)

*Primary Examiner* — George Nguyen
(74) *Attorney, Agent, or Firm* — Drinker Biddle & Reath LLP

(57) ABSTRACT

A working object grinding method capable of grinding a working object reliably is provided. A working object 1 is irradiated with a laser beam while locating a converging point therewithin, so as to form a reformed region 7 in the working object 1 along a reformed-region forming line set at a predetermined distance inside from an outer edge of the working object 1 along the outer edge, and a rear face 21 of the working object 1 is ground. As a result, the reformed region 7 or fissures C1 extending therefrom can inhibit fissures generated in an outer edge portion 25 upon grinding the working object 1 from advancing to the inside, whereby the working object 1 can be prevented from fracturing.

4 Claims, 19 Drawing Sheets

(56) References Cited

U.S. PATENT DOCUMENTS

| | | |
|---|---|---|
| 7,566,635 B2 | 7/2009 | Fujii et al. |
| 7,592,237 B2 | 9/2009 | Sakamoto et al. |
| 7,592,238 B2 | 9/2009 | Fukuyo et al. |
| 7,605,344 B2 | 10/2009 | Fukumitsu |
| 7,608,214 B2 | 10/2009 | Kuno et al. |
| 7,615,721 B2 | 11/2009 | Fukuyo et al. |
| 7,626,137 B2 | 12/2009 | Fukuyo et al. |
| 7,709,767 B2 | 5/2010 | Sakamoto |
| 7,718,510 B2 | 5/2010 | Sakamoto et al. |
| 7,719,017 B2 | 5/2010 | Tanaka |
| 7,732,730 B2 | 6/2010 | Fukuyo et al. |
| 7,749,867 B2 | 7/2010 | Fukuyo et al. |
| 7,754,583 B2 | 7/2010 | Sakamoto |
| 7,825,350 B2 | 11/2010 | Fukuyo et al. |
| 7,897,487 B2 | 3/2011 | Sugiura et al. |
| 7,902,636 B2 | 3/2011 | Sugiura et al. |
| 7,939,430 B2 | 5/2011 | Sakamoto et al. |
| 7,947,574 B2 | 5/2011 | Sakamoto et al. |
| 2005/0202596 A1 | 9/2005 | Fukuyo et al. |
| 2005/0214973 A1* | 9/2005 | Oyu et al. .................... 438/106 |
| 2005/0272223 A1 | 12/2005 | Fujii et al. |
| 2006/0144828 A1 | 7/2006 | Fukumitsu et al. |
| 2006/0148212 A1 | 7/2006 | Fukuyo et al. |
| 2007/0085099 A1 | 4/2007 | Fukumitsu et al. |
| 2007/0125757 A1 | 6/2007 | Fukuyo et al. |
| 2007/0158314 A1 | 7/2007 | Fukumitsu et al. |
| 2007/0252154 A1 | 11/2007 | Uchiyama et al. |
| 2007/0255024 A1 | 11/2007 | Fukuyo et al. |
| 2008/0035611 A1 | 2/2008 | Kuno et al. |
| 2008/0037003 A1 | 2/2008 | Atsumi et al. |
| 2008/0090382 A1 | 4/2008 | Fujii et al. |
| 2008/0218735 A1 | 9/2008 | Atsumi et al. |
| 2008/0251506 A1 | 10/2008 | Atsumi et al. |
| 2009/0008373 A1 | 1/2009 | Muramatsu et al. |
| 2009/0032509 A1 | 2/2009 | Kuno et al. |
| 2009/0098713 A1 | 4/2009 | Sakamoto |
| 2009/0107967 A1 | 4/2009 | Sakamoto et al. |
| 2009/0117712 A1 | 5/2009 | Sakamoto et al. |
| 2009/0166342 A1 | 7/2009 | Kuno et al. |
| 2009/0166808 A1 | 7/2009 | Sakamoto et al. |
| 2009/0250446 A1 | 10/2009 | Sakamoto |
| 2009/0261083 A1 | 10/2009 | Osajima et al. |
| 2009/0302428 A1 | 12/2009 | Sakamoto et al. |
| 2010/0006548 A1 | 1/2010 | Atsumi et al. |
| 2010/0009547 A1 | 1/2010 | Sakamoto |
| 2010/0012632 A1 | 1/2010 | Sakamoto |
| 2010/0012633 A1 | 1/2010 | Atsumi et al. |
| 2010/0015783 A1 | 1/2010 | Fukuyo et al. |
| 2010/0025386 A1 | 2/2010 | Kuno et al. |
| 2010/0032418 A1 | 2/2010 | Kuno et al. |
| 2010/0055876 A1 | 3/2010 | Fukuyo et al. |
| 2010/0151202 A1 | 6/2010 | Fukumitsu |
| 2010/0176100 A1 | 7/2010 | Fukuyo et al. |
| 2010/0184271 A1 | 7/2010 | Sugiura et al. |
| 2010/0200550 A1 | 8/2010 | Kumagai |
| 2010/0203678 A1 | 8/2010 | Fukumitsu et al. |
| 2010/0203707 A1 | 8/2010 | Fujii et al. |
| 2010/0227453 A1 | 9/2010 | Sakamoto |
| 2010/0240159 A1 | 9/2010 | Kumagai et al. |
| 2010/0258539 A1 | 10/2010 | Sakamoto |
| 2010/0301521 A1 | 12/2010 | Uchiyama |
| 2010/0327416 A1 | 12/2010 | Fukumitsu |
| 2011/0000897 A1 | 1/2011 | Nakano et al. |
| 2011/0001220 A1 | 1/2011 | Sugiura et al. |
| 2011/0021004 A1 | 1/2011 | Fukuyo et al. |
| 2011/0027971 A1 | 2/2011 | Fukuyo et al. |
| 2011/0027972 A1 | 2/2011 | Fukuyo et al. |
| 2011/0037149 A1 | 2/2011 | Fukuyo et al. |
| 2011/0274128 A1 | 11/2011 | Fukumitsu et al. |

FOREIGN PATENT DOCUMENTS

| | | |
|---|---|---|
| JP | 63-47049 | 2/1988 |
| JP | 2004-111606 | 4/2004 |
| JP | 2004-349623 | 12/2004 |
| JP | 2006-108532 | 4/2006 |
| JP | 2007-96115 | 4/2007 |
| JP | 2007-235068 | 9/2007 |
| WO | 2003-076118 | 9/2003 |

OTHER PUBLICATIONS

U.S. Appl. No. 13/269,274, filed Oct. 7, 2011.
U.S. Appl. No. 13/235,936, filed Sep. 19, 2011.
U.S. Appl. No. 13/213,175, filed Aug. 19, 2011.
U.S. Appl. No. 13/233,662, filed Sep. 15, 2011.
U.S. Appl. No. 13/061,438, filed Apr. 26, 2011.
U.S. Appl. No. 13/107,056, filed May 13, 2011.
U.S. Appl. No. 13/151,877, filed Jun. 2, 2011.
U.S. Appl. No. 13/131,429, filed Jun. 28, 2011.
U.S. Appl. No. 13/143,636, filed Sep. 21, 2011.
U.S. Appl. No. 13/148,097, filed Aug. 26, 2011.
U.S. Appl. No. 13/262,995, filed Oct. 5, 2011.
U.S. Appl. No. 13/265,027, filed Oct. 18, 2011.
K. Hayashi, "Inner Glass Marking by Harmonics of Solid State Laser", Proceedings of 45$^{th}$ Lasers Materials Processing Conference, Dec. 1998, pp. 23-28, including English Abstract.
K. Miura et al., "Formation of Photo-induced Structures in Glasses with Femtosecond Laser", Proceedings of 42nd Lasers Materials Processing Conference, Nov. 1997, pp. 105-111, including English Abstract.
T. Sano et al., "Evaluation of Processing Characteristics of Silicon with Picosecond Pulse Laser", Preprints of the National Meeting of Japan Welding Society, No. 66, Apr. 2000, pp. 72-73, including English Translation.
X. Liu et al., "Laser Ablation and Micromachining with Ultrashort Laser Pulses," IEEE Journal of Quantum Electronics, vol. 33, No. 10, Oct. 1997, pp. 1706-1716.

* cited by examiner

*Fig.11*
(a)
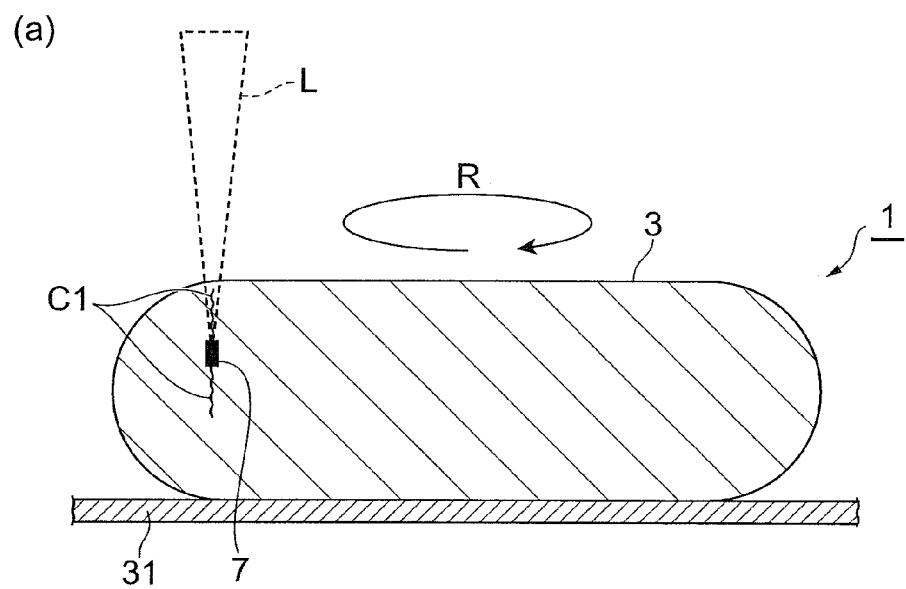
(b)
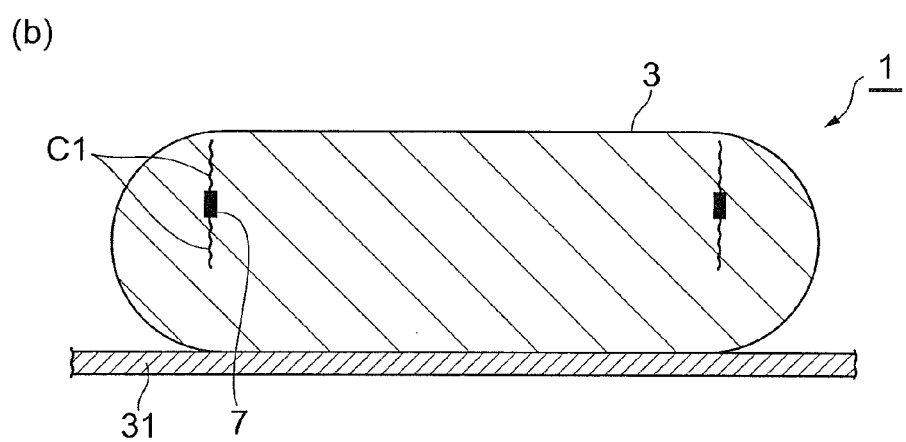

Fig.12
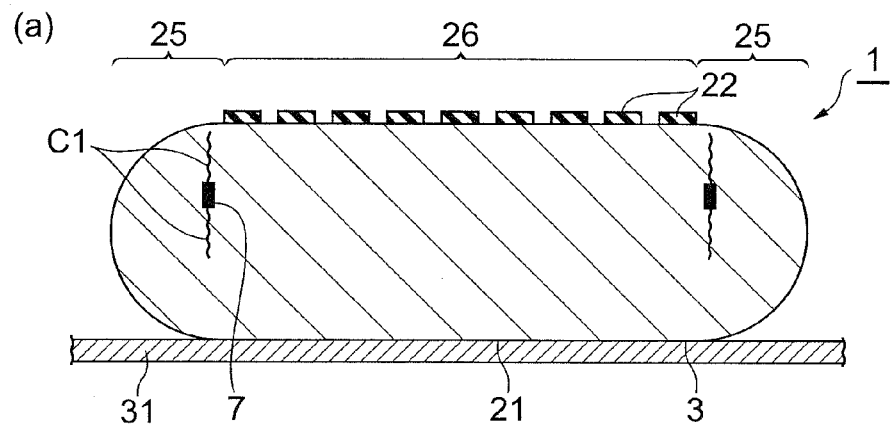
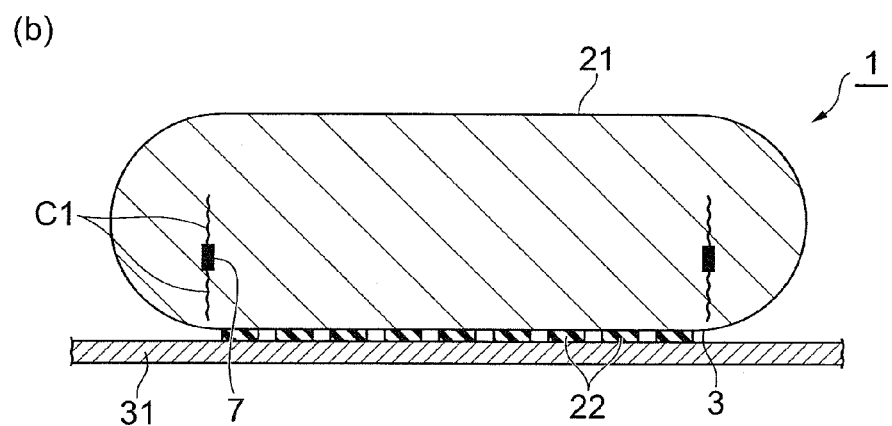
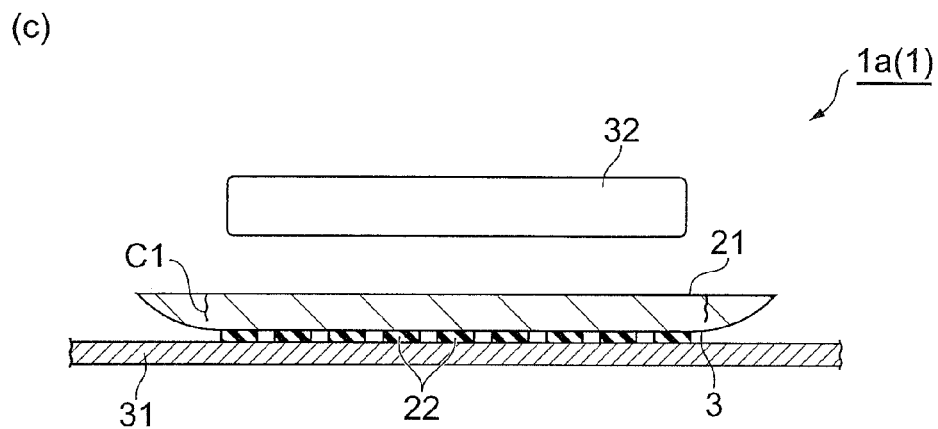

*Fig.13*
(a)
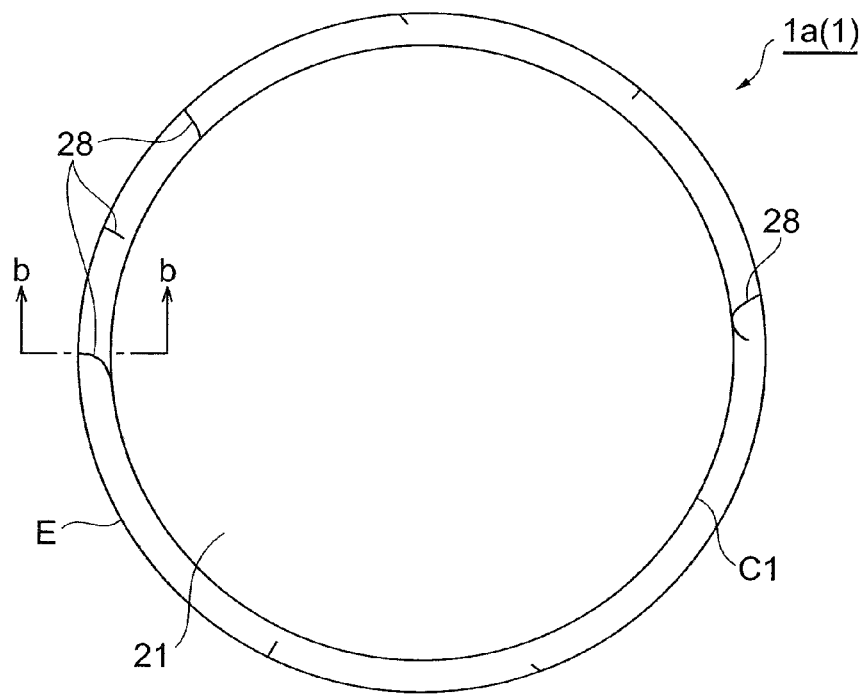
(b)
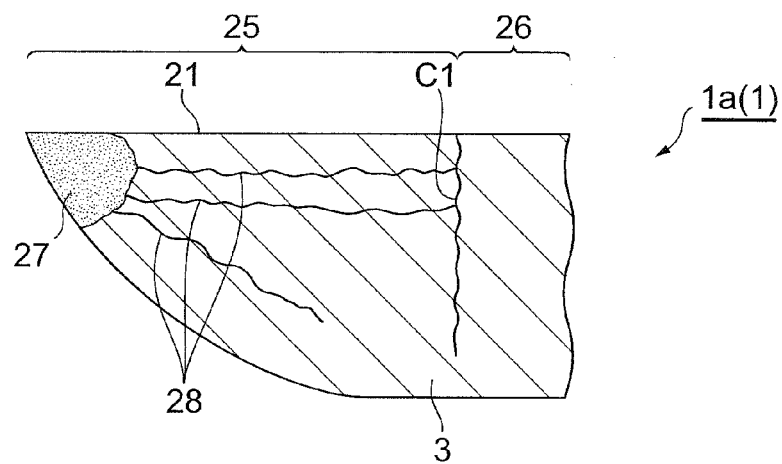

*Fig.14*
(a)
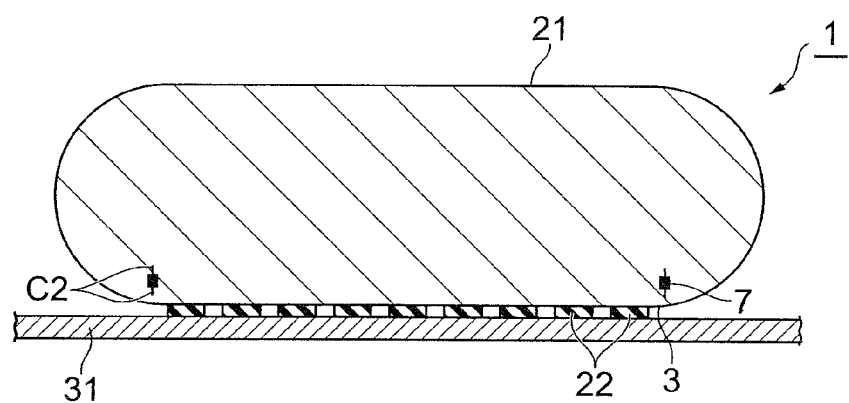
(b)
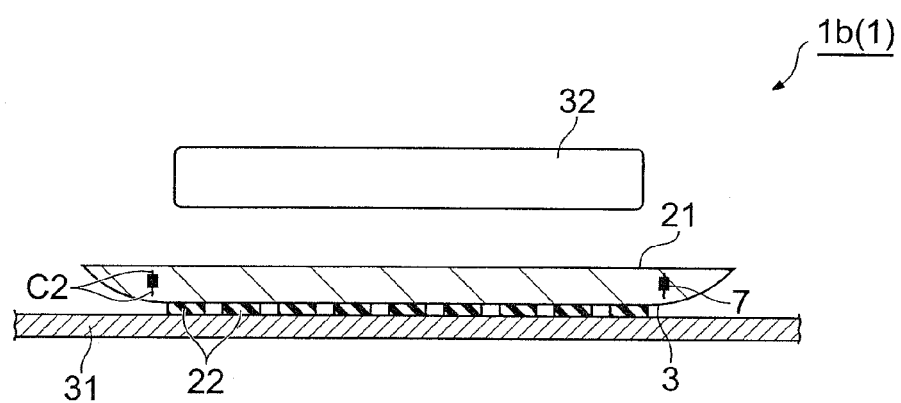

Fig.15
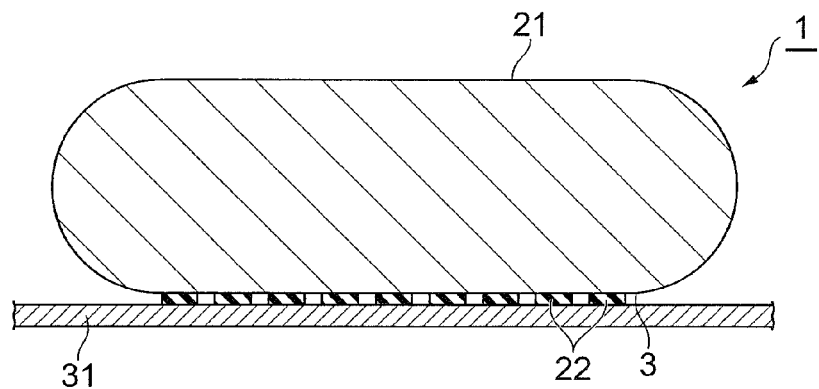
(a)
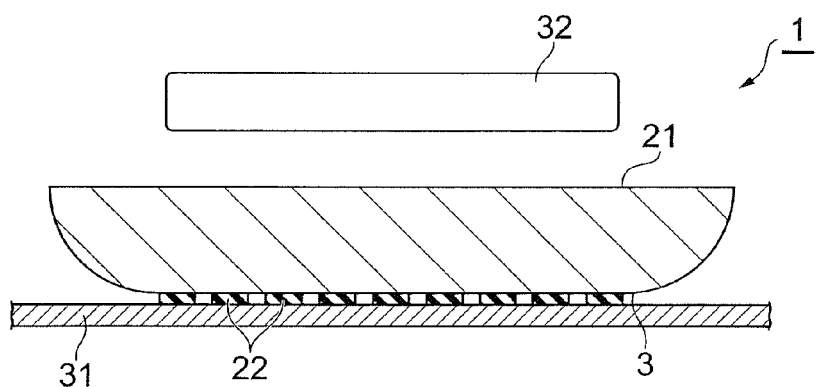
(b)
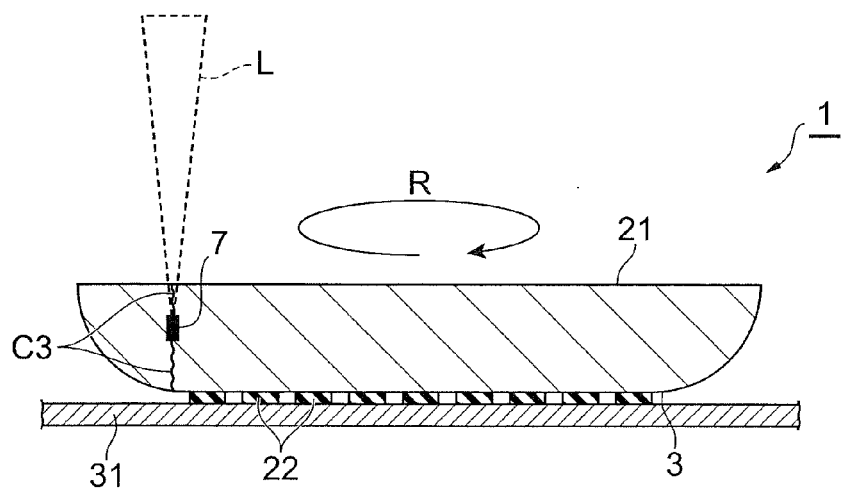
(c)

*Fig.16*
(a)
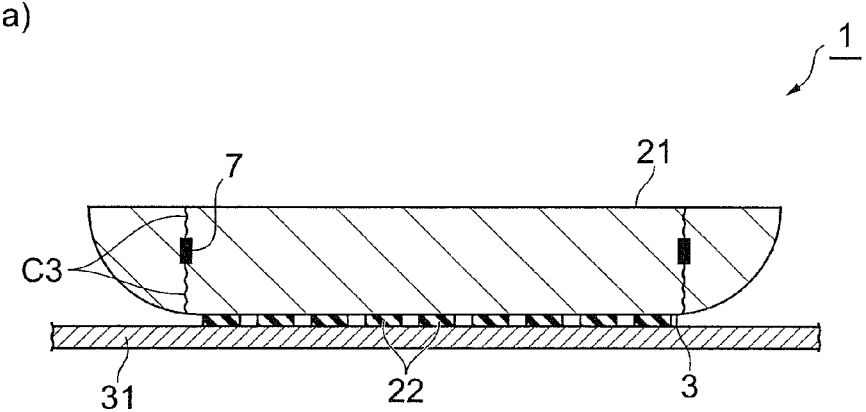
(b)
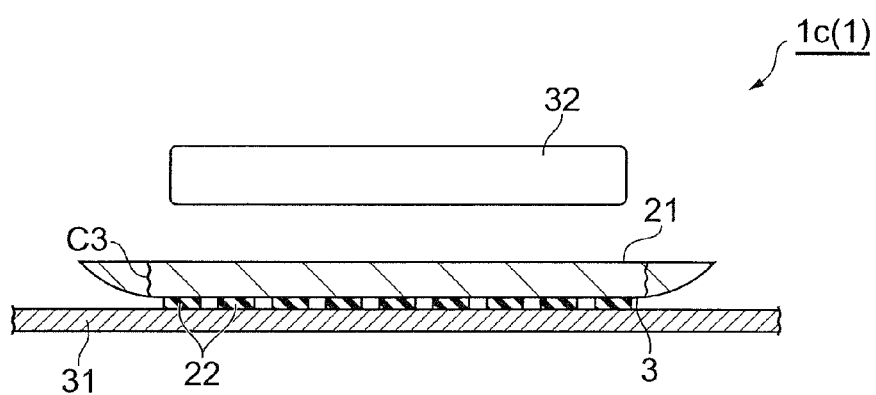

Fig.17
(a)
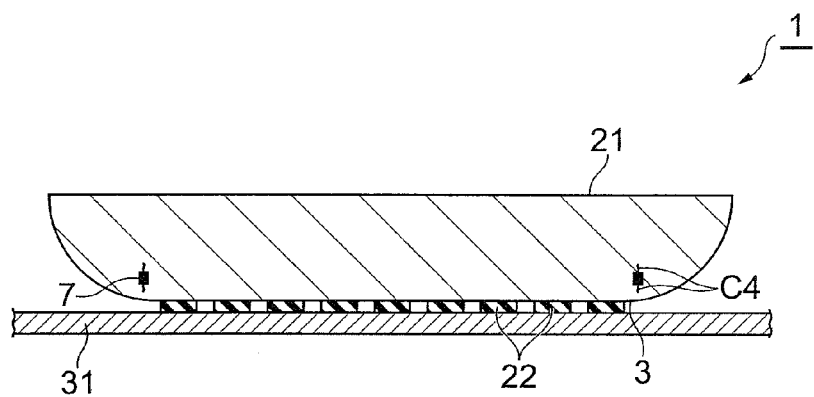
(b)
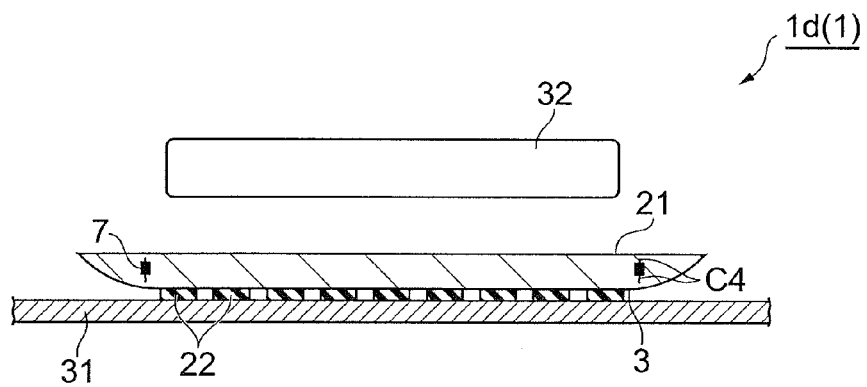

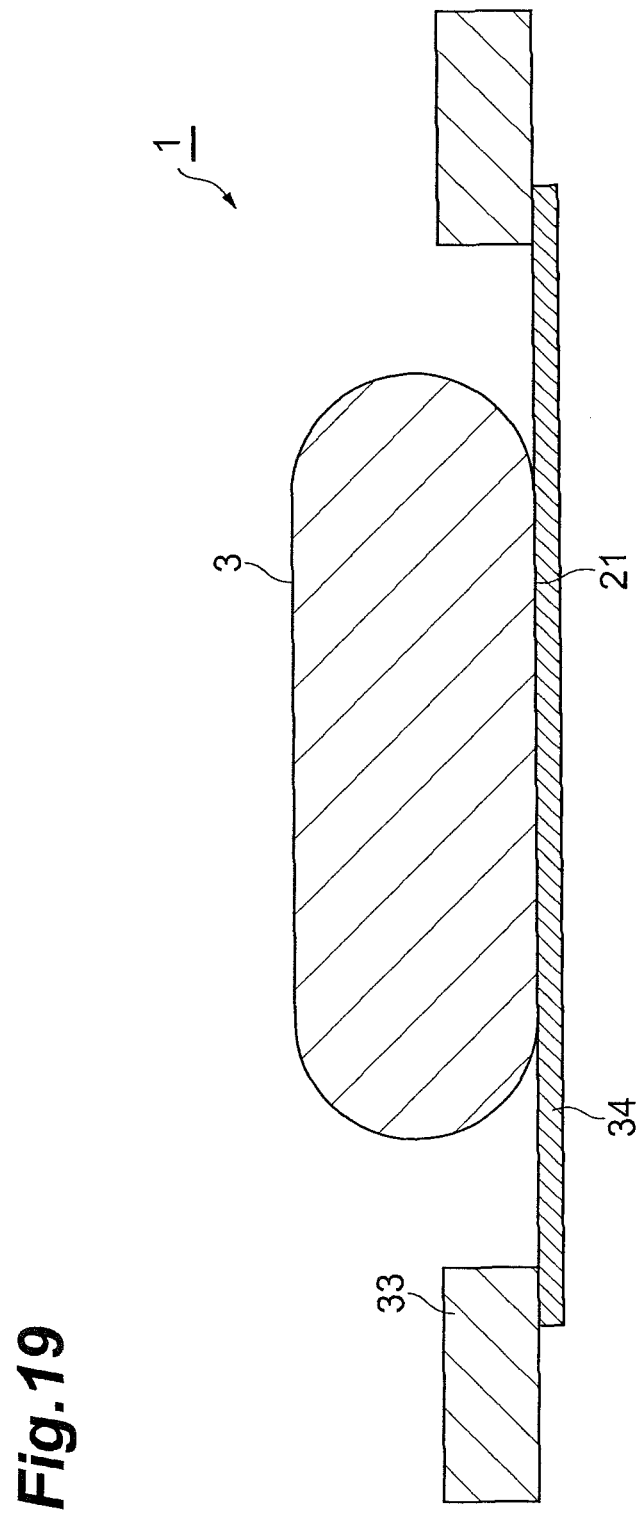

… working object; 5 … reformed-
region forming line; 7 … reformed region; 21 … rear face

WORKING OBJECT GRINDING METHOD

TECHNICAL FIELD

The present invention relates to a working object grinding method for grinding a working object to a predetermined thickness.

BACKGROUND ART

Known as a conventional working object grinding method is one irradiating the inside of a planar working object with a laser beam, so as to remove an outer edge portion of the working object, and grinding a main face of the working object after removing the outer edge portion (see, for example, Patent Literature 1). Such a working object grinding method aims to prevent knife edges from occurring at an outer edge of the working object.

Patent Literature 1: Japanese Patent Application Laid-Open No. 2006-108532

DISCLOSURE OF INVENTION

Technical Problem

However, working object grinding methods such as the one mentioned above have a problem that fractures occurring in outer edge portions of the working object when grinding the working object, if any, may extend to the inside, thereby breaking the working object. When the ground working object is thin, chipping (breakage) is easier to occur in the outer edge portions of the working object, whereby the above-mentioned problem becomes remarkable. Further, depending on the thickness of the working object, there is a problem that an enormous working processing time with a laser is required for removing the outer edge portions.

It is therefore an object of the present invention to provide a working object grinding method which can reliably grind the working object.

Solution to Problem

For achieving the above-mentioned object, the working object grinding method in accordance with the present invention is a working object grinding method for grinding a planar working object to a predetermined thickness, the method comprising the steps of irradiating the working object with a laser beam while locating a converging point within the working object, so as to form a reformed region in the working object along a reformed-region forming line set at a predetermined distance inside from an outer edge of the working object along the outer edge; and grinding a main face of the working object.

In this working object grinding method, a reformed region is formed in the working object along a reformed-region forming line set at a predetermined distance inside from an outer edge of the working object along the outer edge. The reformed region or a fracture extending from the reformed region can inhibit a fracture generated in an outer edge portion of the working object upon grinding the working object from extending to the inside. As a result, the working object can be ground reliably. The "fracture" encompasses fissures, slits, crevices, and so forth (as in the following).

Preferably, the step of grinding the main face of the working object is carried out after the step of forming the reformed region. In this case, the reformed region or a fracture extending therefrom can inhibit fractures occurring in outer edge portions of the working object, if any, during grinding the working object from extending to the inside.

Preferably, in the step of forming the reformed region, the working object is formed with the reformed region such that a fracture extending from the reformed region is left alone in the working object after grinding. In this case, no reformed region remains in the working object after grinding, whereby dust can be reduced.

Advantageous Effects of Invention

The present invention makes it possible to grind the working object reliably.

BRIEF DESCRIPTION OF DRAWINGS

[FIG. 11] is a schematic sectional view taken along the line XI-XI of FIG. 10 for explaining the working object grinding method in accordance with the first embodiment;

[FIG. 12] is a view subsequent to FIG. 11;

[FIG. 13] is a plan view illustrating the rear face side of the working object after grinding;

[FIG. 14] is a schematic sectional view, corresponding to FIG. 11, for explaining the working object grinding method in accordance with a second embodiment;

[FIG. 15] is a schematic sectional view, corresponding to FIG. 11, for explaining the working object grinding method in accordance with a third embodiment;

[FIG. 16] is a view subsequent to FIG. 15;

[FIG. 17] is a schematic sectional view, corresponding to FIG. 11, for explaining the working object grinding method in accordance with a fourth embodiment;

[FIG. 19] is a schematic sectional view, corresponding to FIG. 11, for explaining another example of the working object grinding method in accordance with any embodiment.

Figure 1:
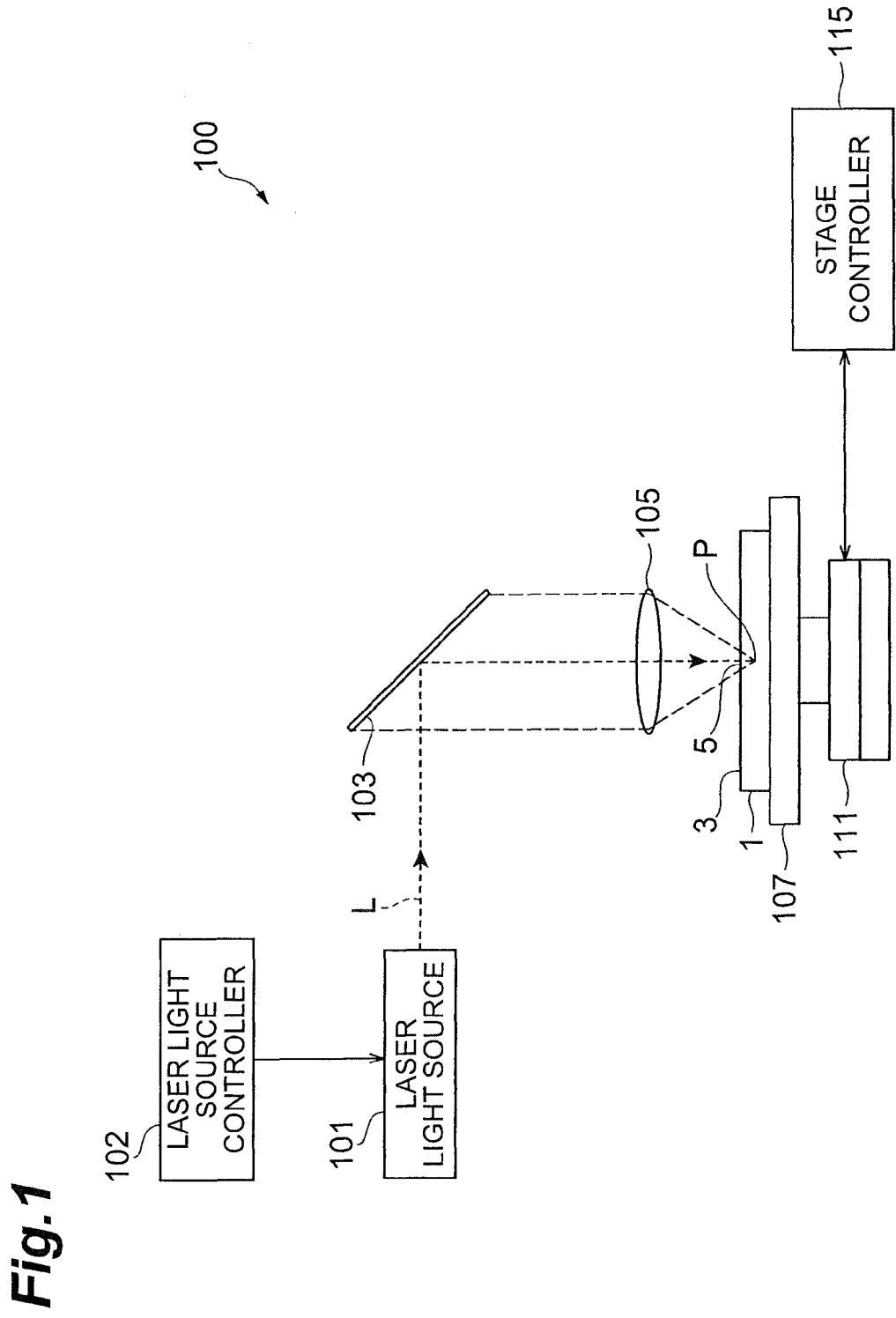
[FIG. 1] is a schematic structural diagram of a laser working apparatus used for forming a reformed region.

REFERENCE SIGNS LIST 1, 1a, 1b, 1c, 1d, 1e … working object; 5 … reformed-region forming line; 7 … reformed region; 21 … rear face (main face); C1 to C5 . . . fissure extending from the reformed region; E . . . outer edge; L . . . laser beam; P . . . converging point Description of Embodiments In the following, preferred embodiments of the present invention will be explained in detail with reference to the drawings. In the drawings, the same or equivalent constituents will be referred to with the same signs while omitting their overlapping explanations.

The working object grinding method in accordance with an embodiment irradiates a planar working object with a laser beam while locating a converging point within the working object, so as to form a reformed region in the working object along a reformed-region forming line set at a predetermined distance inside from an outer edge of the working object along the outer edge. Therefore, the forming of the reformed region will be explained with reference to FIGS. 1 to 9 at first.

As illustrated in FIG. 1, a laser working apparatus 100 comprises a laser light source 101 for pulsatingly oscillating a laser beam L and so forth, a dichroic mirror 103 arranged such as to change the direction of the optical axis of the laser beam L by 90°, and a condenser lens 105 for converging the laser beam L. The laser working apparatus 100 further comprises a support table 107 for supporting a working object 1 which is irradiated with the laser beam L converged by the condenser lens 105, a stage 111 for moving the support table 107 along X, Y, and Z axes and a θ direction about the Z axis (hereinafter simply referred to as "θ direction"), a laser light source controller 102 for regulating the laser light source 101 in order to adjust the output, pulse width, and the like of the laser beam L, and a stage controller 115 for regulating movements of the stage 111.

In the laser processing apparatus 100, the laser beam L emitted from the laser light source 101 changes the direction of its optical axis by 90° with the dichroic mirror 103, and then is converged by the condenser lens 105 into the working object 1 mounted on the support table 107. At the same time, the stage 111 is shifted, so that the working object 1 is moved relative to the laser beam L along a reformed-region forming line 5. As a consequence, a reformed region to become a cutting start point is formed in the working object 1 along the reformed-region forming line 5. This reformed region will be explained in detail in the following.

Figure 2:
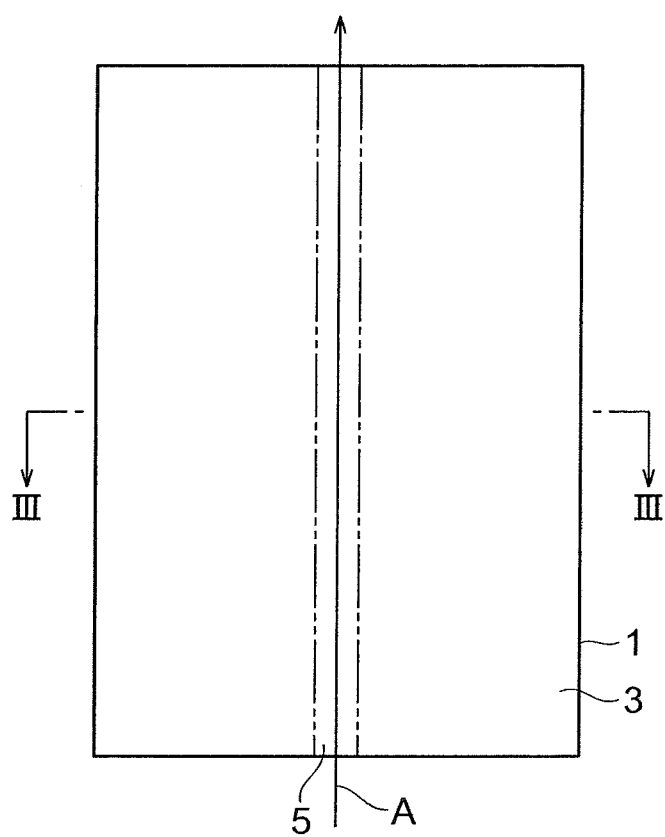
[FIG. 2] is a plan view of a working object for which the reformed region is formed.
Figure 3:
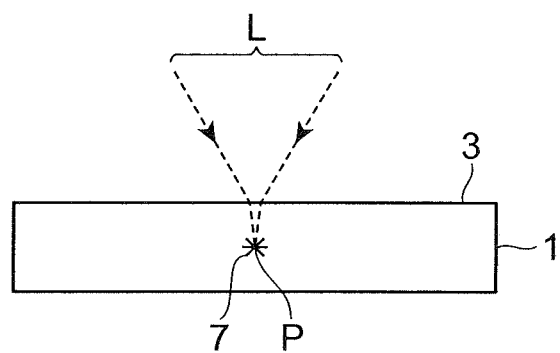
[FIG. 3] is a sectional view of the working object taken along the line III-III of FIG. 2.
Figure 4:
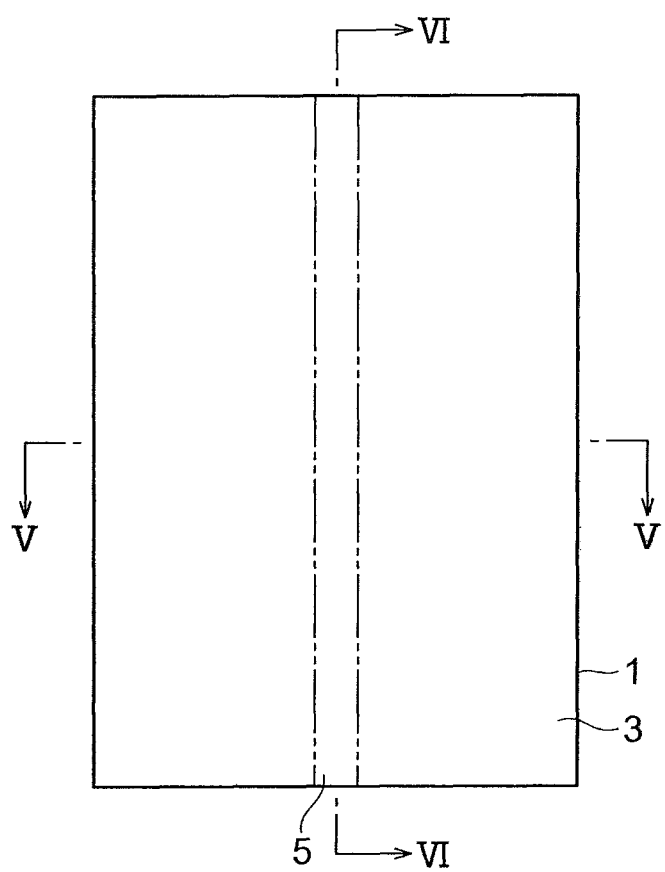
[FIG. 4] is a plan view of the working object after laser working.
Figure 5:
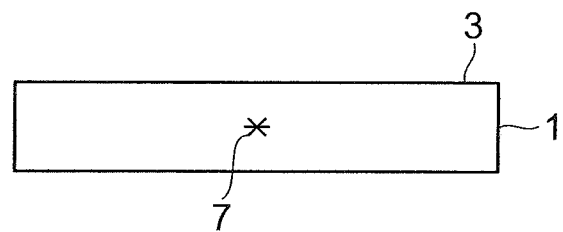
[FIG. 5] is a sectional view of the working object taken along the line V-V of FIG. 4.
Figure 6:
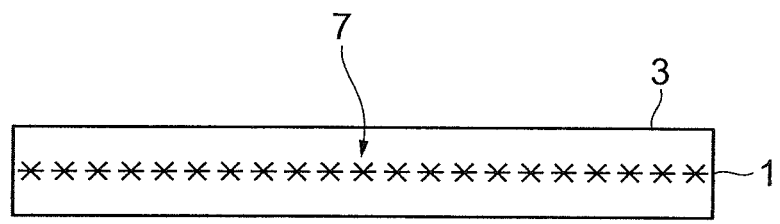
[FIG. 6] is a sectional view of the working object taken along the line VI-VI of FIG. 4.

As illustrated in FIG. 2, the reformed-region forming line 5 for cutting the planar working object 1 is set therein. The reformed-region forming line 5 is a virtual line extending straight. When forming a reformed region within the working object 1, the laser beam L is relatively moved along the reformed-region forming line 5 (i.e., in the direction of arrow A in FIG. 2) while locating a converging point P within the working object 1 as illustrated in FIG. 3. This forms a reformed region 7 within the working object 1 along the reformed-region forming line 5 as illustrated in FIGS. 4 to 6.

The converging point P is a position at which the laser beam L is converged. The reformed-region forming line 5 may be curved instead of being straight, and may be a line actually drawn on the front face 3 of the working object 1 without being restricted to the virtual line. The reformed region 7 may be formed either continuously or intermittently. It will be sufficient if the reformed region 7 is formed at least within the working object 1. There are cases where fissures are formed from the reformed region 7 acting as a start point, and the fissures and reformed region 7 may be exposed at outer surfaces (the front face, rear face, and outer peripheral face) of the working object 1.

Here, the laser beam L is absorbed in particular in the vicinity of the converging point within the working object 1 while being transmitted therethrough, whereby the reformed region 7 is formed in the working object 1 (i.e., internal absorption type laser working). Therefore, the front face 3 of the working object 1 hardly absorbs the laser beam L and thus does not melt. In the case of forming a removing part such as a hole or groove by melting it away from the front face 3 (i.e., surface absorption type laser working), the working region gradually progresses from the front face 3 side to the rear face side in general.

The reformed region formed in this embodiment refers to regions whose physical characteristics such as density, refractive index, and mechanical strength have attained states different from those of their surroundings. Examples of the reformed region include (1) molten processed regions, (2) crack regions or dielectric breakdown regions, (3) refractive index changed regions, and their mixed regions.

The reformed region in this embodiment can be formed by local absorption of a laser beam or a phenomenon known as multiphoton absorption. A material becomes transparent when its absorption bandgap $E_G$ is greater than photon energy hv, so that a condition under which absorption occurs in the material is $hv > E_G$. However, even when optically transparent, the material generates absorption under a condition of $nhv > E_G$ (where n=2, 3, 4, . . . ) if the intensity of laser light becomes very high. This phenomenon is known as multiphoton absorption. The forming of a molten processed region by multiphoton absorption is disclosed, for example, in "Silicon Processing Characteristic Evaluation by Picosecond Pulse Laser", Preprints of the National Meetings of Japan Welding Society, Vol. 66 (April, 2000), pp. 72-73.

Also, reformed regions formed by employing an ultrashort-pulsed laser bean having a pulse width of several picoseconds to femtoseconds may be utilized as described in D. Du, X. Liu, G. Korn, J. Squier, and G. Mourou, "Laser Induced Breakdown by Impact Ionization in $SiO_2$ with Pulse Widths from 7 ns to 150 fs", Appl. Phys. Lett. 64(23), Jun. 6, 1994.

(1) Case where the Reformed Region Includes a Molten Processed Region

A working object (e.g., semiconductor material such as silicon) is irradiated with the laser beam L while locating a converging point within the working object under a condition with a field intensity of at least $1 \times 10^8$ (W/cm$^2$) at the converging point and a pulse width of 1 μs or less. As a consequence, the laser beam L is absorbed in the vicinity of the converging point, so that the inside of the working object is locally heated, and this heating forms a molten processed region within the working object.

The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure changes to another structure among monocrystal, amorphous, and polycrystal structures. For example, it means a region having changed from the monocrystal structure to the amorphous structure, a region having changed from the monocrystal structure to the polycrystal structure, or a region having changed from the monocrystal structure to a structure containing amorphous and polycrystal structures. When the working object is of a silicon monocrystal structure, the molten processed region is an amorphous silicon structure, for example.

Figure 7:
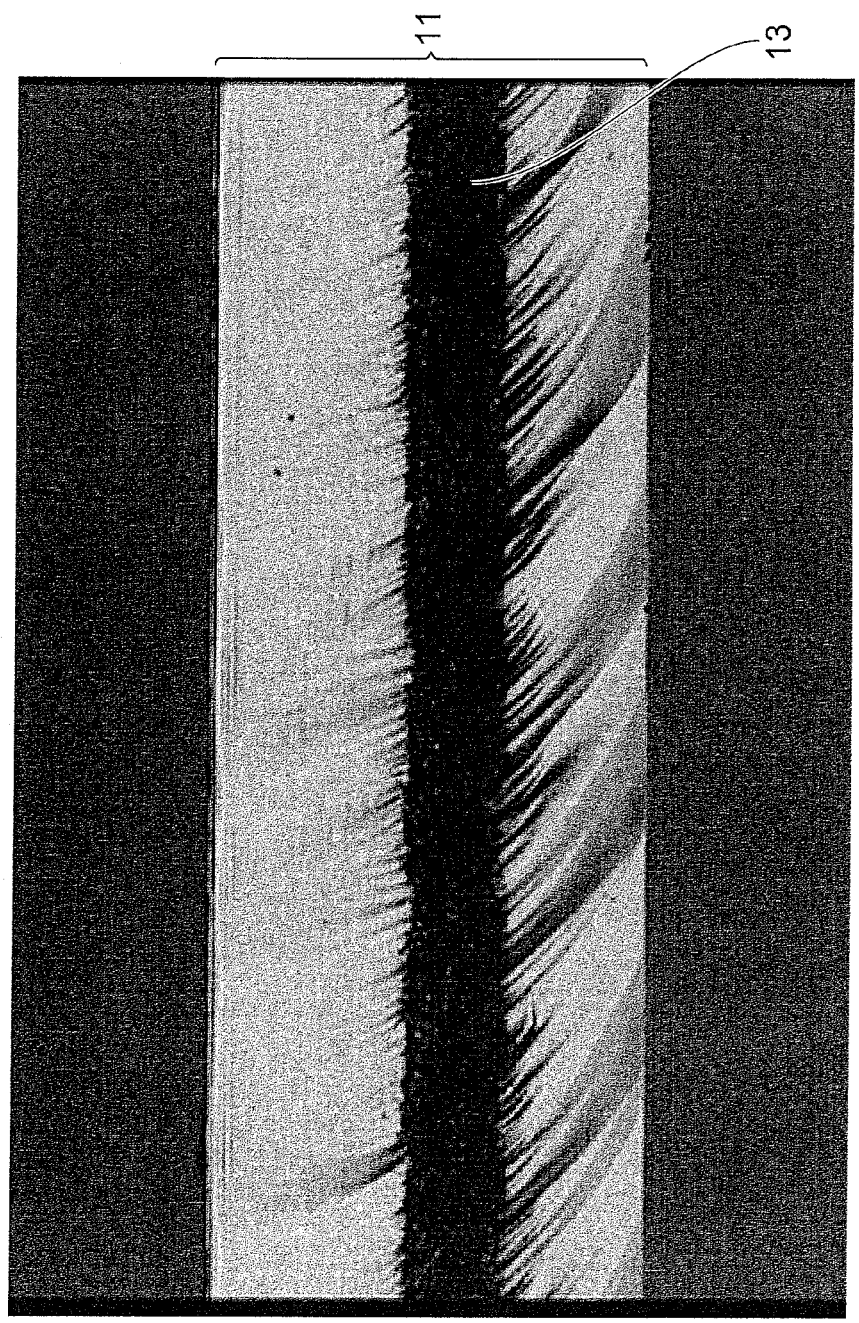
[FIG. 7] is a view illustrating a photograph of a cut section of a silicon wafer after laser working.

FIG. 7 is a view illustrating a photograph of a cross section in a part of a silicon wafer (semiconductor substrate) irradiated with a laser beam. As illustrated in FIG. 7, a molten processed region 13 is formed within a semiconductor substrate 11.

Figure 8:
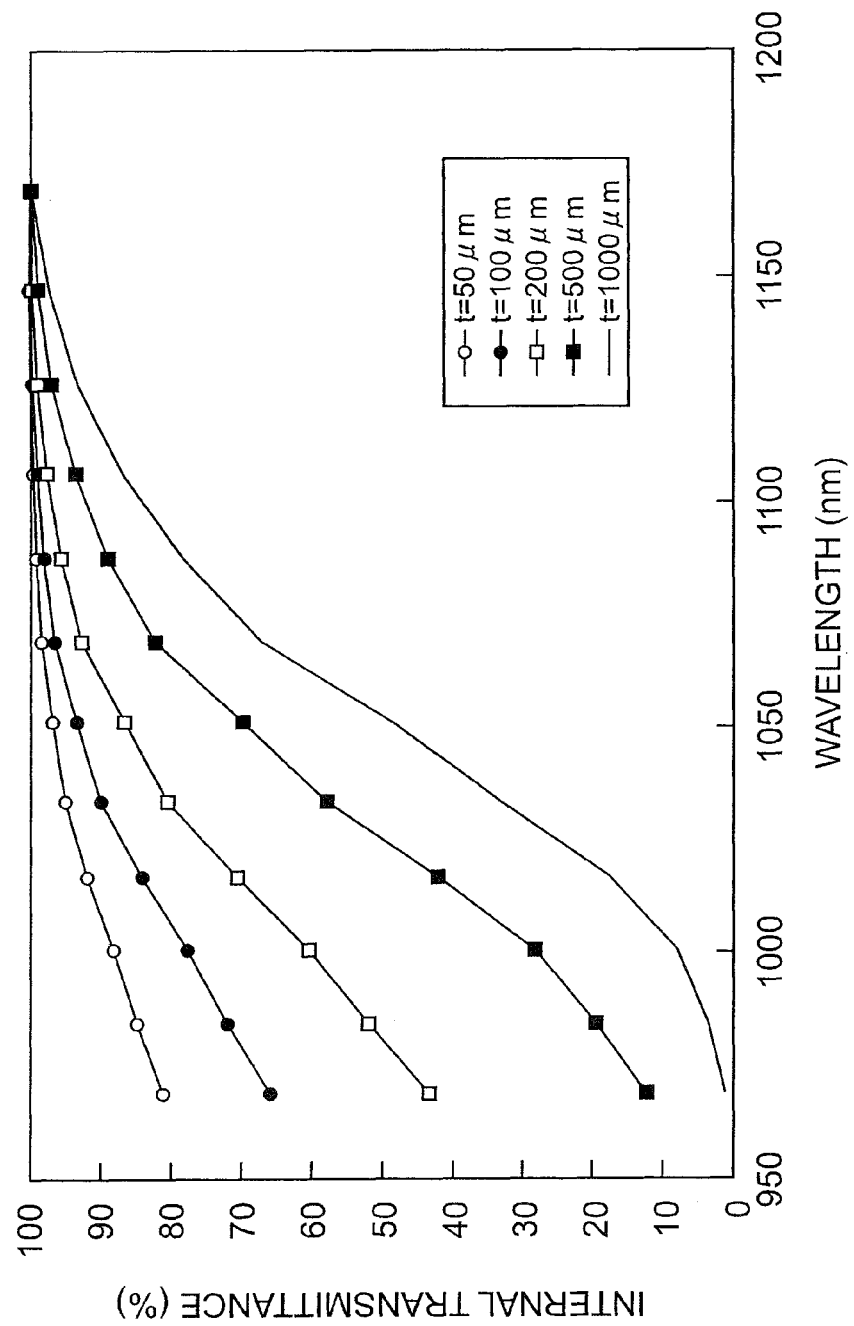
[FIG. 8] is a graph illustrating relationships between the laser beam wavelength and the transmittance within a silicon substrate.

The fact that the molten processed region 13 is formed within a material transparent to the wavelength of the laser beam incident thereon will now be explained. FIG. 8 is a graph illustrating relationships between the laser beam wavelength and the transmittance within the silicon substrate. Here, the respective reflected components on the front and rear face sides of the silicon substrate are eliminated, so as to indicate the internal transmittance alone. The respective relationships are represented in the cases where the thickness t of the silicon substrate is 50 μm, 100 μm, 200 μm, 500 μm, and 1000 μm.

For example, at the Nd:YAG laser wavelength of 1064 nm, the laser beam L appears to be transmitted through the silicon substrate by at least 80% when the silicon substrate has a thickness of 500 μm or less. Since the semiconductor substrate 11 represented in FIG. 7 has a thickness of 350 μm, the molten processed region 13 is formed near the center of the semiconductor substrate 11, i.e., at a part distanced from the front face by 175 μm. The transmittance in this case is 90% or more with reference to a silicon wafer having a thickness of 200 μm, whereby the laser beam L is absorbed only slightly within the semiconductor substrate 11 but is substantially transmitted therethrough. When converged within the silicon wafer under the condition of at least $1 \times 10^8$ (W/cm$^2$) with a pulse width of 1 μs or less, however, the laser beam L is locally absorbed at the converging point and its vicinity, whereby the molten processed region 13 is formed within the semiconductor substrate 11.

There is a case where fissures occur in the silicon wafer from the molten processed region acting as a start point. There is also a case where fissures are formed as being incorporated in the molten processed region. In the latter case, the fissures may be formed over the whole surface of the molten processed region or in only a part or a plurality of parts thereof. These fissures may grow naturally or as a force is exerted on the silicon wafer. The fractures naturally growing from the molten processed region include both of cases where they grow from a state in which the molten processed region is molten and where they grow when the molten processed region is re-solidified from the molten state. In either case, the molten processed region is formed only within the silicon wafer and, when at a cut section, within the cut section as illustrated in FIG. 7.

(2) Case where the Reformed Region Includes a Crack Region

A working object (e.g., glass or a piezoelectric material made of LiTaO$_3$) is irradiated with the laser beam L while locating a converging point therewithin under a condition with a field intensity of at least $1 \times 10^8$ (W/cm$^2$) at the converging point and a pulse width of 1 μs or less. This magnitude of pulse width is a condition under which the laser beam L is absorbed within the working object so that a crack region is formed therein. This generates a phenomenon of optical damage within the working object. This optical damage induces a thermal distortion within the working object, thereby forming a crack region including a crack or a plurality of cracks within the working object. The crack region may also be referred to as a dielectric breakdown region.

Figure 9:
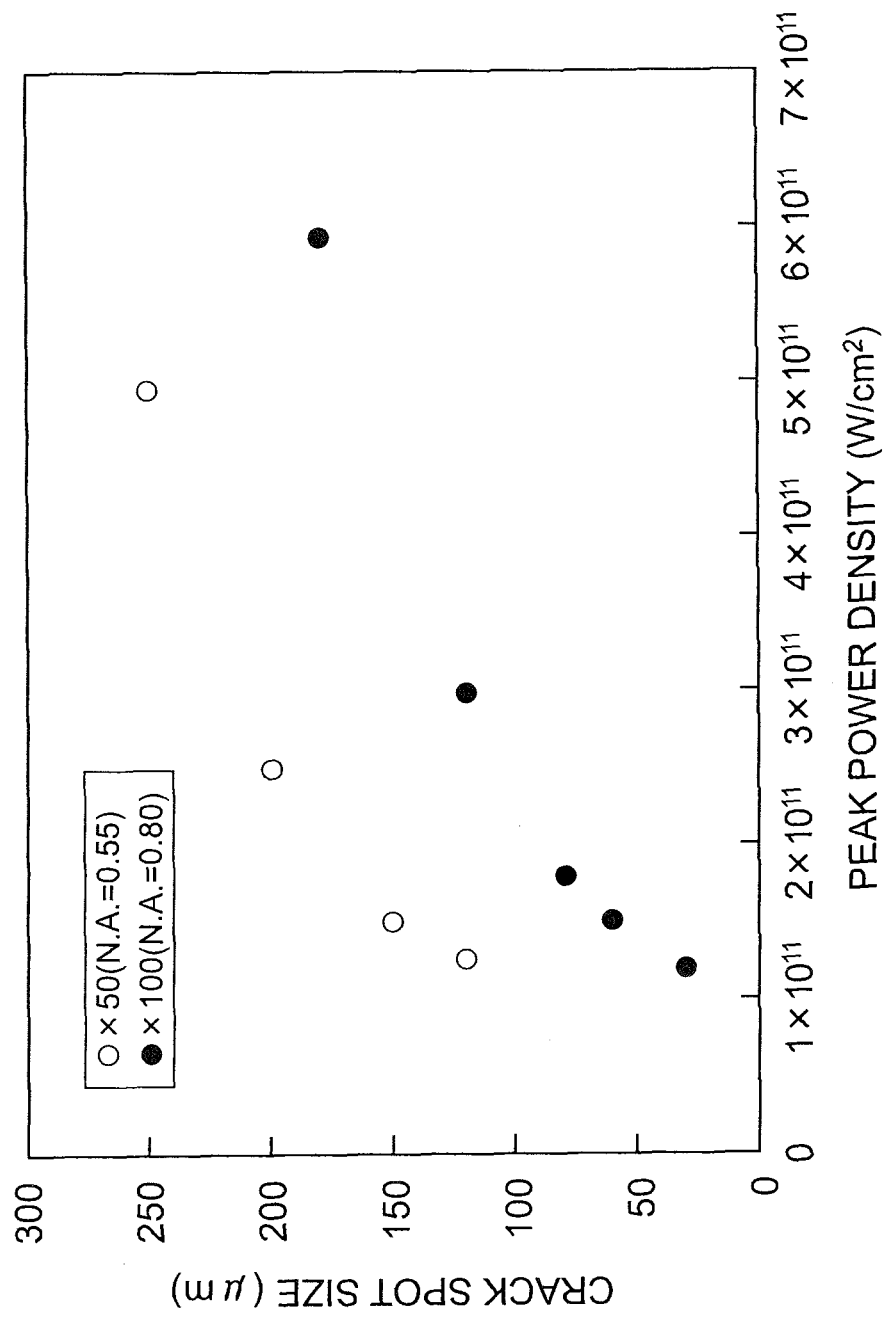
[FIG. 9] is a graph illustrating relationships between the peak power density of a laser beam and crack spot size.

FIG. 9 is a graph illustrating results of experiments concerning relationships between the field intensity and crack size. The abscissa indicates the peak power density. Since the laser beam L is a pulsed laser beam, the field intensity is represented by the peak power density. The ordinate indicates the size of a crack part (crack spot) formed within the object by one pulse of the laser beam L. Crack spots gather to yield a crack region. The crack spot size is the size of a part yielding the maximum length among forms of crack spots. Data represented by black circles in the graph refer to a case where the condenser lens (C) has a magnification of ×100 and a numerical aperture (NA) of 0.80. On the other hand, data represented by whitened circles in the graph refer to a case where the condenser lens (C) has a magnification of ×50 and a numerical aperture (NA) of 0.55. Crack spots are seen to occur within the working object from when the peak power density is about $10^{11}$ (W/cm$^2$) and become greater as the peak power density increases.

(3) Case where the Reformed Region Includes a Refractive Index Changed Region

A working object (e.g., glass) is irradiated with the laser beam L while locating a converging point within the working object under a condition with a field intensity of at least $1 \times 10^8$ (W/cm$^2$) at the converging point and a pulse width of 1 ns or less. When the laser beam L is thus absorbed within the working object while having a very short pulse width, its energy is not converted into thermal energy, whereby an eternal structure change such as ion valence change, crystallization, or orientation polarization is induced within the working object, thus forming a refractive index changed region.

The reformed region, which encompasses the molten processed regions, dielectric breakdown regions, refractive index changed regions, and their mixed regions, may be an area where the density of the reformed region has changed from that of an unreformed region in the material or an area formed with a lattice defect. They can collectively be referred to as a high-density transitional region.

The molten processed regions, refractive index changed regions, areas where the reformed region has a density different from that of the unreformed region, or areas formed with a lattice defect may further incorporate a fissure (fracture or microcrack) therewithin or at an interface between the reformed and unreformed regions. The incorporated fissure may be formed over the whole surface of the reformed region or in only a part or a plurality of parts thereof.

Preferably, the reformed region is formed as follows while taking account of the crystal structure of the working object, its cleavage characteristic, and the like.

That is, in the case of a substrate made of a monocrystal semiconductor having a diamond structure such as silicon, it will be preferred if the reformed region is formed in a direction extending along a (111) plane (first cleavage plane) or a (110) plane (second cleavage plane). In the case of a substrate made of a group III-V compound semiconductor of sphalerite structure such as GaAs, it will be preferred if the reformed region is formed in a direction extending along a (110) plane. In the case of a substrate having a crystal structure of hexagonal system such as sapphire (Al$_2$O$_3$), it will be preferred if the reformed region is formed in a direction extending along a (1120) plane (A plane) or a (1100) plane (M plane) while using a (0001) plane (C plane) as a principal plane.

When the substrate is formed with an orientation flat in a direction to be formed with the above-mentioned reformed region (e.g., a direction extending along a (111) plane in a monocrystal silicon substrate) or a direction orthogonal to the direction to be formed therewith, the reformed region can be formed easily and accurately in the substrate with reference to the orientation flat.

The working object grinding method in accordance with the first embodiment of the present invention will now be explained.

Figure 10:
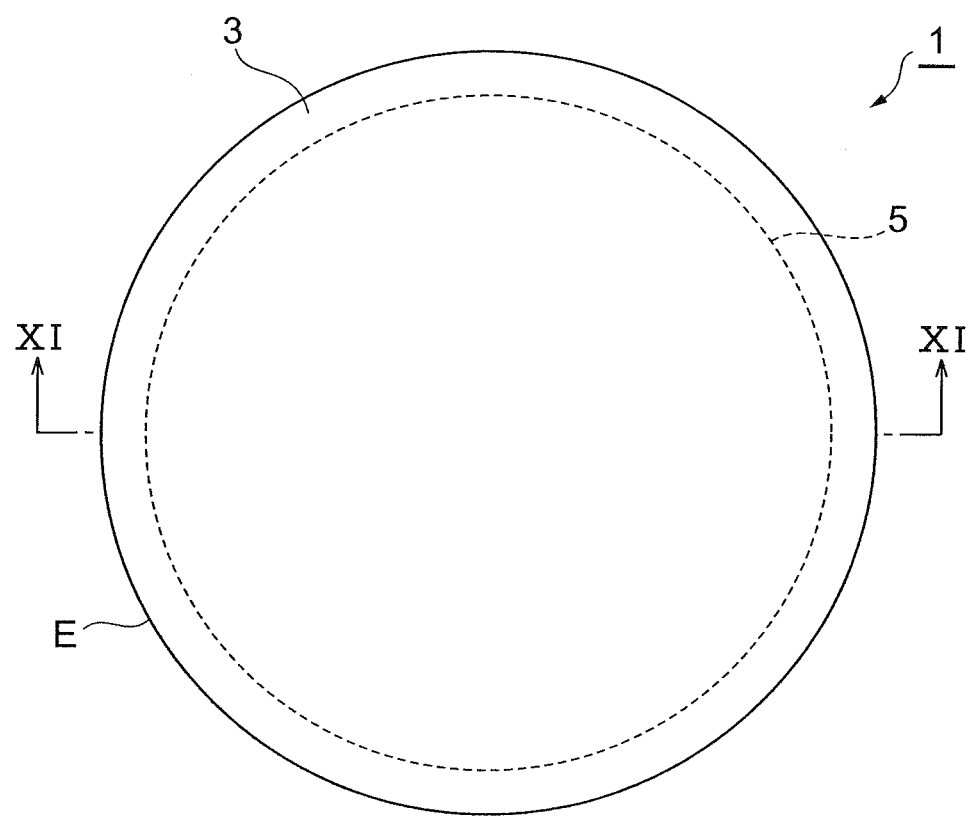
[FIG. 10] is a plan view of a working object to which the working object grinding method in accordance with a first embodiment is applied.

The working object grinding method of this embodiment is one which grinds the working object in order to form a very thin semiconductor substrate having a thickness of 15 to 25 μm (a predetermined thickness, which will hereinafter be referred to as "final grinding thickness"). As illustrated in FIG. 10, the working object 1 to be ground is shaped like a disc made of silicon. Here, the working object 1 is formed by cutting a cylindrical silicon ingot into round slices. A reformed-region forming line 5 is set at a predetermined distance inside from an outer edge E of the working object 1. For convenience of explanation, the orientation flat is omitted in the working object 1. The "grinding" herein refers to smoothing a surface by shaving the same mechanically, chemically, or electrochemically with a whetstone, a blade, an etchant, or the like, and is synonymous with polishing.

The reformed-region forming line 5 has an annular form extending along the outer edge E of the working object 1. As illustrated in FIG. 12(a), the reformed-region forming line 5 is set at the boundary between an outer edge portion 25 and an effective region 26 located inside of the outer edge portion 25 in the working object 1. The outer edge portion 25 is a portion constructed such as to include a side face projecting as a curved surface in the working object 1. The outer edge portion 25 has an arcuate cross section in a side view, so that its thickness tapers down toward the outer edge. The outer edge portion 25 may have a semiarcuate or rectangular cross section in a side view and may linearly taper down its thickness toward the outer edge.

The effective region 26 is a region for forming functional devices 22 examples of which include semiconductor operating layers formed by crystal growth, light-receiving devices such as photodiodes, light-emitting devices such as laser diodes, and circuit devices formed as circuits.

When subjecting the working object 1 explained in the foregoing to grinding, a tape 31 is attached to the rear face (main face) 21 of the working object 1 so as to hold it at first, and the working object 1 is mounted on a stage (not depicted) such that the front face 3 faces up as illustrated in FIG. 11(a). As the tape 31, a BG (Back Grind) tape is used here. The working object 1 may be mounted on the stage while being held with a holding jig or holding substrate.

In this state, the stage is rotated in the θ direction (the direction of depicted arrow R) relative to the laser beam L while the working object 1 is irradiated with the laser beam L from the front face 3 side with a converging point located within the working object 1. This forms the reformed region 7 within the working object 1 along the reformed-region forming line 5 (see FIG. 10) at the outer peripheral edge as illustrated in FIG. 11(b) and causes fissures (fractures) C1 to extend thickwise from the upper and lower end portions of the reformed region 7. The reformed region 7 may include fissures therewithin.

Subsequently, a plurality of functional devices 22 are formed in the effective region 26 on the front face 3 of the working object 1 such as to be arranged in a matrix as illustrated in FIG. 12(a), and then the working object 1 is turned upside down such that the rear face 21 faces up as illustrated in FIG. 12(b). Thereafter, the rear face 21 of the working object 1 is ground with a grinding whetstone 32 (grinder) as illustrated in FIG. 12(c), so as to thin the working object 1 to its final grinding thickness. Here, in the working object 1a after grinding, the fissures C1 are left alone and exposed at the rear face 21. That is, the half-cut fissures C1 are exposed at the rear face 21.

After thinning the working object 1, cutting start regions for cutting the working object 1 are formed along cutting-scheduled lines set like grids passing between the functional devices 22 adjacent to each other. Here, the working object is irradiated with a laser beam while locating a converging point thereat, whereby cutting reformed regions similar to the reformed region 7 are formed as the cutting start regions. The cutting start regions may be grooves and the like formed by laser abrasion, scribing, blade dicing, and the like. An expandable tape is then attached to the working object 1 and expanded, whereby the working object 1 is severed (cut) along the cutting-scheduled lines acting as a start point. The working object 1 may also be cut along the reformed-region forming line 5 (see FIG. 10) from the reformed region 7 acting as a start point during or after grinding the working object 1 or at the time of expanding the expandable tape.

There have conventionally been cases where thinning the working object 1 by grinding causes chipping and fissures in the outer edge portion 25, which is thin in particular, and lets the fissures extend to the inside. During grinding the working object 1, a force applied to the working object 1 for grinding may also cause chipping and fissures in the outer edge portion 25 and let the fissures extend to the inside. That is, there is a fear that fractures generated in the outer edge portion 25 upon grinding the working object 1 may extend inward to the effective region 26.

In this regard, the working object grinding method of this embodiment forms the reformed region 7 in the working object 1 along the reformed-region forming line 5 set at a predetermined distance inside from the outer edge E of the working object 1. The reformed region 7 or the fractures C1 extending therefrom can inhibit or block fractures generated in the outer edge portion 25 from extending inward to the effective region 26, whereby the working object can be ground reliably. This effect becomes remarkable in this embodiment in which chipping (breakage) is likely to occur in the outer edge portion 25 in particular since the working object 1a after grinding is very thin.

FIG. 13(a) is a plan view illustrating the rear face side of the working object after grinding by the working object grinding method of this embodiment, while FIG. 13(b) is an enlarged cross-sectional view taken along the line b-b of FIG. 13(a). As illustrated in FIG. 13, a chipping 27 is generated in the outer edge portion 25 of the working object 1a. Fissures 28 extend from the chipping 27 and the outer edge portion 25. Here, when viewed from above, the fissures 28 are seen to be easier to extend in the circumferential direction along which the fissures C1 extend. The fissures 28 are also seen to stop advancing inward at the fissures C1. That is, the reformed region 7 and the fissures C1 extending therefrom serve as a guard which functions as a stopper for keeping the fissures 28 from extending to the inside, thereby keeping the fissures 28 from extending from the outer edge portion 25 to the effective region 26.

As mentioned above, this embodiment grinds the working object 1 after forming the reformed region 7. Therefore, the reformed region 7 or the fissures C1 extending therefrom can inhibit the fissures 28 occurring in the outer edge portion 25 during grinding the working object 1, if any, from advancing to the inside.

In this embodiment, as mentioned above, the fissures C1 are left alone in the working object 1a after grinding. That is, the reformed region 7 is formed in the working object 1 such that only the fissures C1 extending from the reformed region 7 remain in the working object 1a after grinding. In this case, no reformed region remains in the working object 1a after grinding, whereby dust can be reduced.

In this embodiment, as mentioned above, the reformed region 7 is formed at the boundary between the outer edge portion 25 and effective region 26 in the working object 1.

Since the outer edge portion 25 is thinner than the effective region 26, fissures are easier to occur in the outer edge portion 25 in the working object 1. Forming the reformed region 7 at the boundary between the outer edge portion 25 and effective region 26 can reliably inhibit the fissures from extending to the inside. The reformed region 7 may be formed inside of the boundary between the outer edge portion 25 and the effective region 26, whereby the fissures can reliably be inhibited from extending to the inside as in the above. The reformed region 7 may be formed outside of the boundary between the outer edge portion 25 and the effective region 26, whereby the effective region can fully be utilized.

Though the functional devices 22 are formed on the front face 3 of the working object 1 after forming the reformed region 7 therein, the reformed region 7 may be formed after forming the functional devices 22 on the front face 3; the reformed region 7 and the functional devices 22 may be formed in any order. The same also holds for the following embodiments.

The working object grinding method in accordance with the second embodiment of the present invention will now be explained. This embodiment will be explained mainly in terms of its differences from the above-mentioned first embodiment.

In the working object grinding method of this embodiment, as illustrated in FIG. 14(a), the working object 1 in which fissures C2 extending thickwise from the upper and lower end portions of the reformed region 7 are generated is arranged such that the rear face 21 faces up. Subsequently, as illustrated in FIG. 14(b), the rear face 21 of the working object 1 is ground, so as to thin the working object 1 to its final grinding thickness. In the working object 1b after grinding, the reformed region 7 remains, while the reformed region 7 and the fissures C2 extending therefrom are kept from being exposed at the front face 3 and rear face 21.

This embodiment has the same effect as that mentioned above, i.e., the effect of grinding the working object 1 reliably, and the like. Since the reformed region 7 is kept from being exposed at the front face 3 and rear face 21 of the working object 1 after grinding, this embodiment can also reduce dust.

The working object grinding method in accordance with the third embodiment of the present invention will now be explained. This embodiment will be explained mainly in terms of its differences from the above-mentioned first embodiment.

In the working object grinding method in accordance with this embodiment, as illustrated in FIG. 15(a), a plurality of functional devices 22 are formed on the front face 3 of the working object 1, a tape 31 is attached thereto, and the working object 1 is mounted on a stage such that the working object 1 faces up. Then, as illustrated in FIG. 15(b), the rear face 21 of the working object 1 is ground with the grinding whetstone 32, so as to thin the working object 1 to such a state that it is thicker than the final grinding thickness. Here, the working object 1 is thinned to about half the initial thickness. Preferably, the rear face 21 after grinding is finished to about such a roughness as to transmit therethrough the laser beam L with which it will be irradiated later.

In this state, as illustrated in FIG. 15(c), the stage is relatively rotated in the θ direction (direction of arrow R) while the working object 1 is irradiated with the laser beam L from the rear face 21 thereof with a converging point located within the object 1. This forms the reformed region 7 within the working object 1 along the reformed-region forming line 5 and causes fissures C3 to extend thickwise from the upper and lower end portions of the reformed region 7 as illustrated in FIG. 16(a).

Then, as illustrated in FIG. 16(b), the rear face 21 of the working object 1 is ground again with the grinding whetstone 32, so as to thin the working object 1 to the final grinding thickness. Here, in the working object 1c after grinding, the fissures C3 are left alone and exposed at the front and rear faces 3, 21. That is, the half-cut fissures C3 are exposed at the front and rear faces 3, 21.

This embodiment also has the same effect as that mentioned above, i.e., the effect of grinding the working object 1 reliably, and the like. Since the fissures C3 are exposed at both the front and rear faces 3, 21, the fissures generated in the outer edge portion 25 of the working object 1 can further be inhibited from extending to the inside.

The working object grinding method in accordance with the fourth embodiment of the present invention will now be explained. This embodiment will be explained mainly in terms of its differences from the above-mentioned third embodiment.

The working object grinding method in accordance with this embodiment grinds the rear face 21 of the working object 1 with the grinding whetstone 32, so as to thin the working object 1 to a state thicker than the final grinding thickness, and thereafter forms the reformed region 7 within the working object 1 along the reformed-region forming line 5 and generates fissures C4 extending thickwise from the upper and lower end portions of the reformed region 7 as illustrated in FIG. 17(a).

Then, as illustrated in FIG. 17(b), the rear face 21 of the working object 1 is ground with the grinding whetstone 32, so as to thin the working object 1 to the final grinding thickness. In the working object 1d after grinding, the reformed region 7 remains, while the reformed region 7 and fissures C4 extending therefrom are kept from being exposed at the front and rear faces 3, 21.

This embodiment also has the same effect as that mentioned above, i.e., the effect of grinding the working object 1 reliably, and the like. Since the reformed region 7 is kept from being exposed at the front and rear faces 3, 21 of the working object 1d after grinding, this embodiment can reduce dust.

The working object grinding method in accordance with the fifth embodiment of the present invention will now be explained. This embodiment will be explained mainly in terms of its differences from the above-mentioned third embodiment.

Figure 18:
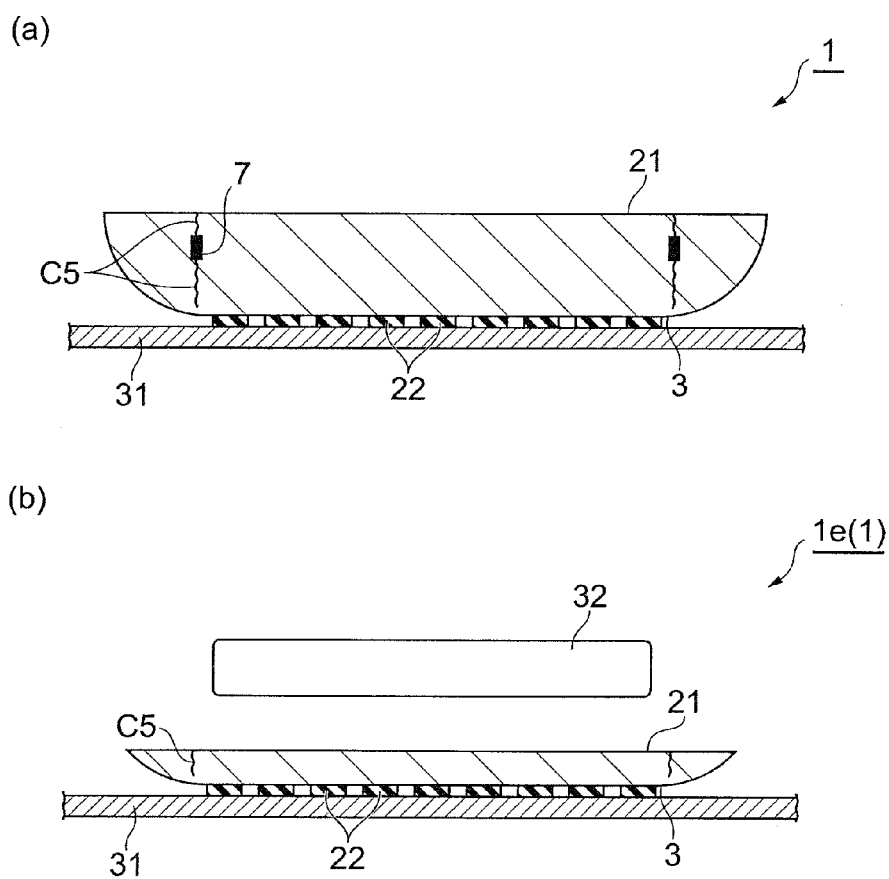
[FIG. 18] is a schematic sectional view, corresponding to FIG. 11, for explaining the working object grinding method in accordance with a fifth embodiment.

The working object grinding method in accordance with this embodiment grinds the rear face 21 of the working object 1 with the grinding whetstone 32, so as to thin the working object 1 to a state thicker than the final grinding thickness, and thereafter forms the reformed region 7 within the working object 1 along the reformed-region forming line 5 and generates fissures C5 extending thickwise from the upper and lower end portions of the reformed region 7 as illustrated in FIG. 18(a).

Then, as illustrated in FIG. 18(b), the rear face 21 of the working object 1 is ground with the grinding whetstone 32, so as to thin the working object 1 to the final grinding thickness. In the working object 1e after grinding, the fissures C5 are left alone and exposed at the rear face 21. That is, the half-cut fissures C5 are exposed at the rear face 21.

This embodiment also has the same effect as that mentioned above, i.e., the effect of grinding the working object 1 reliably, and the like.

The present invention is not limited to the above-mentioned embodiments. For example, while the tape 31 is attached to the working object 1 in the above-mentioned embodiments, other holding devices which can hold the working object 1 may be used, or a dicing tape 34 held by an annular dicing frame 33 may be attached thereto as illustrated in FIG. 19. In this case, the dicing tape 34 can be utilized as the expanding tape that expands when severing the object 1.

Though the working object 1 is ground to the final grinding thickness after forming the working object 1 with the reformed region 7, the working object 1 may be formed with the reformed region 7 after being ground to the final grinding thickness. However, forming the reformed region 7 before grinding is more desirable, since it can stop the fissures 28 occurring from the outer edge portion 25 upon handling after grinding and the like.

Though the reformed region 7 includes the fissures C1 to C5 in the above-mentioned embodiments, the reformed region (molten processed region) may be provided alone. In a method forming a reformed region to become a cutting start point within the working object 1 along a cutting-scheduled line and cutting the working object 1 into chips (i.e., stealth dicing scheme) or a method applying a stress to the working object 1 formed with grooves so as to cut it into chips as in laser scribing, the presence of fissures makes it easier to apply a stress to the working object 1 when expanding the dicing tape, so that the working object 1 is cut easily, and also facilitates the cutting of the outer edge portion 25.

Though the above-mentioned embodiments form the reformed region including a molten processed region in the working object 1 made of a semiconductor material, other reformed regions such as crack regions and refractive index changed regions may be formed within working objects made of other materials such as glass and piezoelectric materials. The fissures in the above-mentioned embodiments may be fractures such as slits and crevices.

Cutting methods such as those of stealth dicing and scribing types mentioned above, complete cutting by lasers, and blade dicing can be utilized for the ground working object 1 formed with the reformed region 7 along the outer edge (outer peripheral circle) E in the present invention.

Industrial Applicability

The present invention can grind the working object reliably.

The invention claimed is:

1. A working object grinding method for grinding a planar working object to a predetermined thickness, the method comprising the steps of:
   irradiating the working object with a laser beam while locating a converging point within the working object, so as to form a reformed region in the working object along a reformed-region forming line set at a predetermined distance inside from an outer edge of the working object along the outer edge; and
   in a state where a main face of a one side of the working object is held by a holding means, grinding a main face of an other side of the working object after forming the reformed region, and leaving alone a fracture extending from the reformed region, without leaving alone the reformed region, to expose the fracture on at least the main face of the other side of the working object.

2. A working object grinding method according to claim 1, wherein
   the working object is shaped like a disc, and
   the reformed-region forming line has an annular form extending along the outer edge of the working object.

3. A working object grinding method for grinding a planar working object to a predetermined thickness, the method comprising the steps of:
   irradiating the working object with a laser beam while locating a converging point within the working object, so as to form a reformed region in the working object along a reformed-region forming line set at a predetermined distance inside from an outer edge of the working object along the outer edge; and
   in a state where a main face of a one side of the working object is held by a holding means, grinding a main face of an other side of the working object after forming the reformed region, and leaving alone the reformed region and a fracture extending from the reformed region so as not to expose the fracture on the main face of the one side and the main face of the other side of the working object.

4. A working object grinding method according to claim 3, wherein
   the working object is shaped like a disc, and
   the reformed-region forming line has an annular form extending along the outer edge of the working object.

* * * * *

UNITED STATES PATENT AND TRADEMARK OFFICE
CERTIFICATE OF CORRECTION

PATENT NO.       : 8,523,636 B2
APPLICATION NO. : 12/744714
DATED            : September 3, 2013
INVENTOR(S)      : Naoki Uchiyama It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 569 days.

Signed and Sealed this

Fifteenth Day of September, 2015

Michelle K. Lee
*Director of the United States Patent and Trademark Office*